(12) United States Patent
Werner et al.

(10) Patent No.: US 9,632,132 B2
(45) Date of Patent: Apr. 25, 2017

(54) TEST DEVICE FOR TESTING A FLAT MODULE

(71) Applicant: Continental Automotive GmbH, Hannover (DE)

(72) Inventors: Erwin Werner, Nuremberg (DE); Martin Gschlossl, Ingolstadt (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 150 days.

(21) Appl. No.: 13/909,437

(22) Filed: Jun. 4, 2013

(65) Prior Publication Data
US 2013/0321023 A1 Dec. 5, 2013

(30) Foreign Application Priority Data

Jun. 4, 2012 (DE) ........................ 10 2012 209 353

(51) Int. Cl.
*G01R 31/28* (2006.01)

(52) U.S. Cl.
CPC ..... *G01R 31/2801* (2013.01); *G01R 31/2808* (2013.01)

(58) Field of Classification Search
CPC ........................ G01R 31/2808; G01R 31/2801
USPC ............ 324/750.16, 750.19, 750.23, 750.24, 324/750.25, 754.08, 754.09, 754.13, 324/756.01, 756.07, 762.01, 763.01
See application file for complete search history.

(56) References Cited

U.S. PATENT DOCUMENTS

| | | | | |
|---|---|---|---|---|
| 4,061,969 A | * | 12/1977 | Dean .................. | G01R 1/07328 324/756.04 |
| 4,774,462 A | * | 9/1988 | Black ....................... | G01R 1/04 324/754.03 |
| 5,559,445 A | * | 9/1996 | Eaddy .................. | G01R 1/0483 324/754.08 |
| 5,572,144 A | * | 11/1996 | Davidson ........... | G01R 1/07314 324/750.19 |
| 5,586,891 A | * | 12/1996 | Kelly ..................... | G01R 1/045 439/70 |

(Continued)

FOREIGN PATENT DOCUMENTS

| | | | | |
|---|---|---|---|---|
| DE | | 10321163 A1 | 12/2004 | .............. B23P 11/00 |
| DE | | 102011054260 | * 10/2011 | |

(Continued)

OTHER PUBLICATIONS

European Search Report, Application No. 11194762.8, 5 pages, Apr. 16, 2012.

(Continued)

*Primary Examiner* — Son Le
*Assistant Examiner* — Akm Zakaria
(74) *Attorney, Agent, or Firm* — Slayden Grubert Beard PLLC

(57) ABSTRACT

A test device for testing a flat module includes a test station and a cover movable relative to the test station between a test position and a removal position. At least two holding devices are arranged and formed on the cover in such a way that, when the cover moves from its removal position into the test position, they releasably connect to the flat module arranged in the test station in such a way that, when the cover moves from its test position into the removal position, the flat module is held by the at least two holding devices.

20 Claims, 4 Drawing Sheets

(56) References Cited

U.S. PATENT DOCUMENTS

| | | | | |
|---|---|---|---|---|
| 5,990,693 A * | 11/1999 | Hayes | ............... | G01R 1/0433 |
| | | | | 324/756.02 |
| 6,045,370 A * | 4/2000 | Treibergs | ............. | G01R 1/0433 |
| | | | | 439/487 |
| 6,351,827 B1 * | 2/2002 | Co | ..................... | G01R 31/01 |
| | | | | 714/29 |
| 6,615,802 B2 | 9/2003 | Reiter et al. | ................. | 123/470 |
| 6,995,578 B2 * | 2/2006 | Shibuya | ............ | G01R 31/2889 |
| | | | | 324/756.07 |
| 2004/0041557 A1 * | 3/2004 | Zhao | ................ | G01R 31/2806 |
| | | | | 324/756.01 |
| 2010/0325870 A1 * | 12/2010 | Planelle | ............ | G01R 31/2893 |
| | | | | 29/592.1 |

FOREIGN PATENT DOCUMENTS

| | | | | |
|---|---|---|---|---|
| DE | 102011054260 A1 | 4/2013 | ............ | G01R 31/28 |
| DE | 202013101438 | * 4/2013 | | |
| EP | 1357284 A1 | 10/2003 | ............ | F02M 61/14 |
| EP | 1754976 A1 | 2/2007 | ............ | G01R 31/28 |
| EP | 2080893 A1 | 7/2009 | ............ | F02M 55/00 |
| WO | 02/12717 A1 | 2/2002 | ............ | F02M 51/06 |

OTHER PUBLICATIONS

International Search Report and Written Opinion, Application No. PCT/EP2012/075354, 10 pages, Feb. 25, 2013.

* cited by examiner

TEST DEVICE FOR TESTING A FLAT MODULE

CROSS-REFERENCE TO RELATED APPLICATIONS

This application claims priority to DE Patent Application No. 10 2012 209 353.2 filed Jun. 4, 2012. The contents of which is incorporated herein by reference in its entirety.

TECHNICAL FIELD

This disclosure relates to a test device for testing a flat module, wherein the test device comprises a test station and a cover movable relative to the test station between a test position and a removal position.

BACKGROUND

A typical test work station consists of a computer-controlled test system, on the front or upper side of which, depending on the test system manufacturer, adapters specific to the test specimen can be docked. The main task of the adapters is to accurately position test specimens in order to press in a positionally correct manner a consequently large amount of electrical spring contacts onto the test specimen with simultaneous generation of counterforces by means of what are known as hold-down devices in order to prevent inadmissible bending of the test specimens. The necessary forces are generated either by mechanical lever action when closing the adapter hood or by means of vacuum application. Commercially available adapters have an upwardly opening hood, which is used to receive hold-down devices and possibly additional spring contacts, and also, in the case of vacuum adapters, to additionally seal the adapter in an air-tight manner.

Test work stations are used to test a specific printed circuit board, once it has been placed onto or into the test device, for faults in the conducting track routing, solder faults and component faults. Entire circuit blocks (clusters) can also be tested. The most well-known test methods for electronic modules of printed circuit board assemblies include the in-circuit test (ICT) and the function test (FCT). Here, test points and component pins provided on the printed circuit board assemblies are contacted directly in the test device with spring contact pins or rigid nails and can then be measured.

Test work stations are increasingly no longer combined in an organizational and spatial manner in what are known as test fields, but are integrated into production lines arranged in a U-shaped manner. For reasons of flexibility, these lines are not linked together by automatic transport systems.

In contrast to conventional assembly lines, workers do not remain at a work station at which they are supplied with parts individually or collectively in containers for processing, but rotate within a partial operating sequence or even the entire line and transport the parts. Ideally, the individual operations operate in a fully automated manner. Part deposit positions exist, ideally arranged one above the other, in order to keep the work stations narrow for the purpose of providing the shortest possible routes for the workers. One position is used only for intermediate storage of a finished part until the worker picks it up immediately once he has placed a part to be processed into the second position. The worker does not wait, but proceeds with the removed part to the next work station. When the worker next approaches the work station, if the processing of the part last inserted is finished, the processing position is free again. This cycle repeats itself.

Conventional test work stations or adapter thereof do not function ideally in the above sense. A first module brought from the previous work station first has to be deposited on a first deposit station next to the adapter. Once the adapter is opened, the tested module is removed and deposited on a second deposit station. The first module is then collected from the first deposit station and is placed into the adapter. The test procedure is started with the closure of the adapter hood and the worker takes the second module from the second deposit station and proceeds to the next work station.

SUMMARY

One embodiment provides a test device for testing a flat module, wherein the test device comprises a test station and a cover movable relative to the test station between a test position and a removal position, wherein at least two holding devices are arranged and formed on the cover in such a way that, when the cover moves from its removal position into the test position, they releasably connect to the flat module arranged in the test station in such a way that, when the cover moves from its test position into the removal position, the flat module is held by the at least two holding devices.

In a further embodiment, a respective holding device is formed in such a way that the holding force for holding the flat module is produced by a force-locked and/or interlocked connection.

In a further embodiment, a respective holding device is formed and/or arranged in such a way that it can be brought into engagement with an outer contour of the flat module, in particular of a printed circuit board of the flat module.

In a further embodiment, a respective holding device is deflectable or resilient at least in some portions.

In a further embodiment, a portion having resilient properties comprises a spring element.

In a further embodiment, a portion having resilient properties is formed from a plastic.

In a further embodiment, the deflectable or resilient portion is designed to generate a restoring force counteracting the deflection.

In a further embodiment, a deflection of the at least one holding device is permitted in a direction that is approximately parallel to a primary plane of the flat module.

In a further embodiment, a respective holding device comprises a detent lug.

In a further embodiment, the detent lug is formed by a groove in the holding device.

In a further embodiment, the groove is formed as an indentation with and/or without edges.

In a further embodiment, the portion having the detent lug is formed from a non-resilient material.

In a further embodiment, the portion of the holding device having the detent lug is formed from a wear-resistant material.

In a further embodiment, the at least two holding devices are provided in addition to hold-down devices.

BRIEF DESCRIPTION OF THE DRAWINGS

Example embodiments are in greater detail below with reference to the drawings, in which.

DETAILED DESCRIPTION

Figure 1:
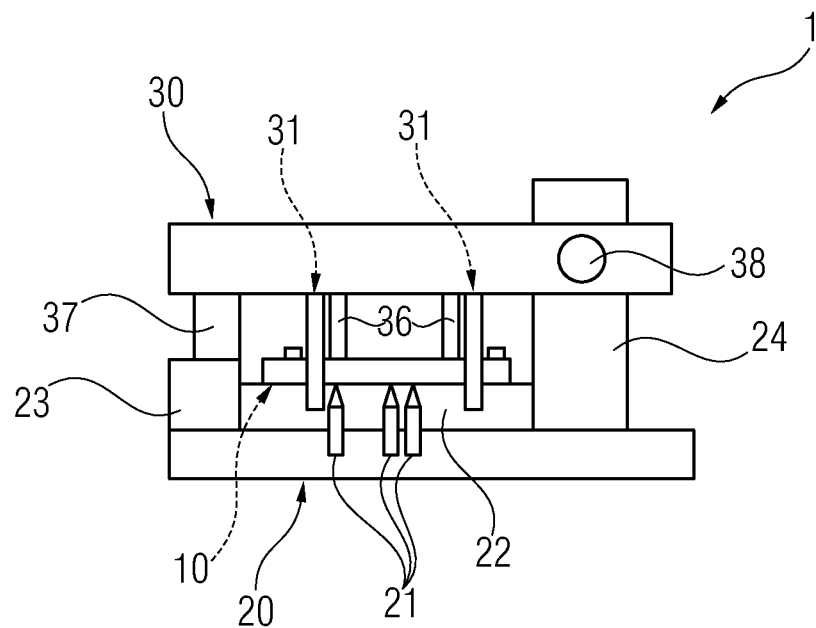
FIG. 1 shows a schematic cross-sectional illustration of a test device according to one embodiment, wherein a cover of the test device is located in a test position.

Embodiments of the present disclosure provide a test device for testing a flat module, said test device being improved in terms of structure and/or function.

For example, some embodiments provide a test device (test adapter) for testing a flat module. The device comprises a test station and a cover movable relative to the test station between a test position and a removal position. At least two holding devices are arranged and formed on the cover in such a way that, when the cover moves from its removal position into the test position, they releasably connect to the flat module arranged in the test station in such a way that, when the cover moves from its test position into the removal position, the flat module is held by the at least two holding devices.

Within the context of the present disclosure, a flat module is to be understood to mean an electronic module, in which at least one electronic component is arranged on a printed circuit board. Here, the extension of the module in length and width is much greater than in height.

Due to the provision of the holding devices, which hold and remove from the test station the flat module just tested as the cover is opened from its test position into the removal position, a deposit surface next to the test device can be saved, since, when the cover is open, a new flat module to be tested can be deposited on the test station. The tested module is then removed from the holding device of the cover. After the removal, the cover can be closed and the flat module deposited on the test station can be tested. Handling operations, in particular in a one-piece-flow, can thus be considerably improved.

A respective holding device is expediently designed in such a way that the holding force for holding a flat module is produced by a force-locked and/or interlocked connection. Both variants enable a destruction-free releasable connection of the holding devices to the flat module.

In a further embodiment, a respective holding device is formed in such a way that it can be brought into engagement with an outer contour of the flat module, in particular of a printed circuit board of the flat module.

A respective holding device is expediently formed so as to be deflectable or resilient at least in some portions. The holding device embodied accordingly can therefore be deflected over the outer contour of the flat module as the cover moves from its removal position into the test position, and can then be connected in a force-locked and/or interlocked manner to the flat module.

A portion having resilient properties may comprise a spring element in this case. Alternatively, a portion having resilient properties may also be formed from a plastic, which has elastic properties and, as a result, is deformable in a resettable and desired manner.

It is expedient if the deflectable or resilient portion is designed to generate a restoring force counteracting the deflection. It is thus ensured that, after the deflection of the holding devices due to the movement relative to one another of the holding device and of the flat module arranged on the work station, the necessary force for producing the force-locked and/or the interlocked connection is applied as soon as the releasable connection to the flat module is produced.

In particular, a deflection of the at least one holding device is permitted in a direction that is approximately parallel to a primary plane of the flat module.

In one embodiment, a respective holding device comprises a detent lug. The detent lug can be formed by a groove in the holding device. Here, the groove can be formed as an indentation with and/or without edges. An undulating or an angular or a combined cross-sectional profile is thus produced selectively.

It is also expedient if a portion comprising the detent lug is formed from a non-resilient material. In particular, a portion of the holding device comprising the detent lug may be formed from a wear-resistant material. A high service life of the holding devices in the test device is thus ensured.

It is also expedient if the at least two holding devices are provided in addition to hold-down devices.

The holding devices can be screwed or fitted into the cover selectively. If flat modules of different size are to be tested in the test device, the holding devices can thus be introduced at selected screw openings or plug openings provided in the cover so as to handle in a desired manner the respective flat module to be processed.

Figure 2:
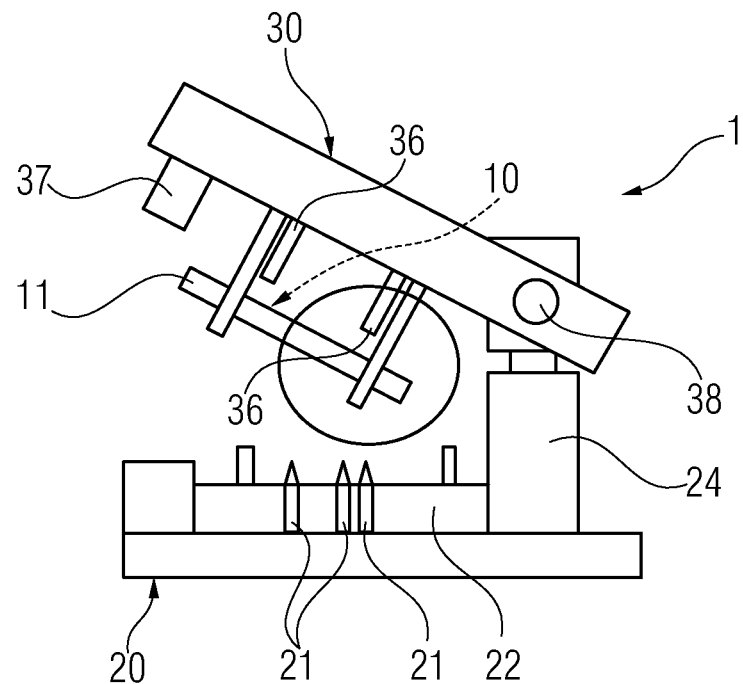
FIG. 2 shows a schematic cross-sectional illustration of a test device according to one embodiment, wherein the cover of the test device is located in a removal position.

FIGS. 1 and 2 each show a schematic cross-sectional illustration of a test device 1 according to one embodiment for testing a flat module 10. Here, the test device is illustrated in FIG. 1 in its test position and in FIG. 2 in its removal position. The flat module 10 to be tested by means of the test device 1 is an electronic module, in which at least one electronic component (not illustrated in the following figures) is arranged on a printed circuit board 11. Here, the extension of the module, that is to say of the printed circuit board 11, in length and width is much greater than in height.

The test device 1 comprises a test station 20 and also a cover 30 for closing the test station 20.

The test station 20 comprises a support surface 22 for the flat module 10 to be tested, from the underside of which test prods 21 protrude in the direction of the cover 30 in a manner known to a person skilled in the art. The support surface 22 of the test station 20 is defined from the sides by walls 23, 24.

The wall 24 is connected to the cover 30 via an articulation 38. The cover 30 can thus be pivoted with respect to the test station 20 between the removal position and the test position. A further wall 37 is provided on a side of the cover 30 opposite the articulation 38 and, in the test position of the test device, rests on the wall 23 of the test station 20.

Generally, the test station 20 and the cover 30 are embodied in such a way that, in the test position shown in FIG. 1, the interior defined by the cover 30 and the test station 20 is sealed or can be sealed.

Hold-down devices 36 and also at least two holding devices 31 are also arranged in a manner likewise known to a person skilled in the art on a side of the cover 30 facing towards the test station 20. The hold-down devices 36, of which merely two are illustrated by way of example, are used during the test procedure to generate a counterforce to the counterforce applied by the test prods 21 to the printed circuit board 11.

As soon as the cover has been brought from its removal position into the test position in order to hold the flat module 10 in the event of a reversed movement (that is to say from the test position into the removal position), the holding devices 31, of which merely two are likewise illustrated by way of example, provide a force-locked and/or interlocked connection to the flat module to be tested. In the removal position, in which the cover 30 of the test device 1 is open, the flat module just tested therefore remains on the holding devices 31, as is illustrated in FIG. 2. This makes it possible, before the flat module already tested is removed from the cover, to insert a new flat module to be tested onto or into the test station 20 and to only then remove the flat module 11 already tested from the cover 30.

The number of holding devices 31 provided in the cover and the arrangement thereof on the cover 30 is dimensioned in accordance with the size and design of the flat module to be tested. It is preferable if the holding devices 31 can be screwed into the cover or fitted into the openings provided therein. Here, many more openings or screw threads than holding devices 31 can be provided in order to achieve a greater flexibility in terms of the arrangements of the holding devices.

Figure 3:
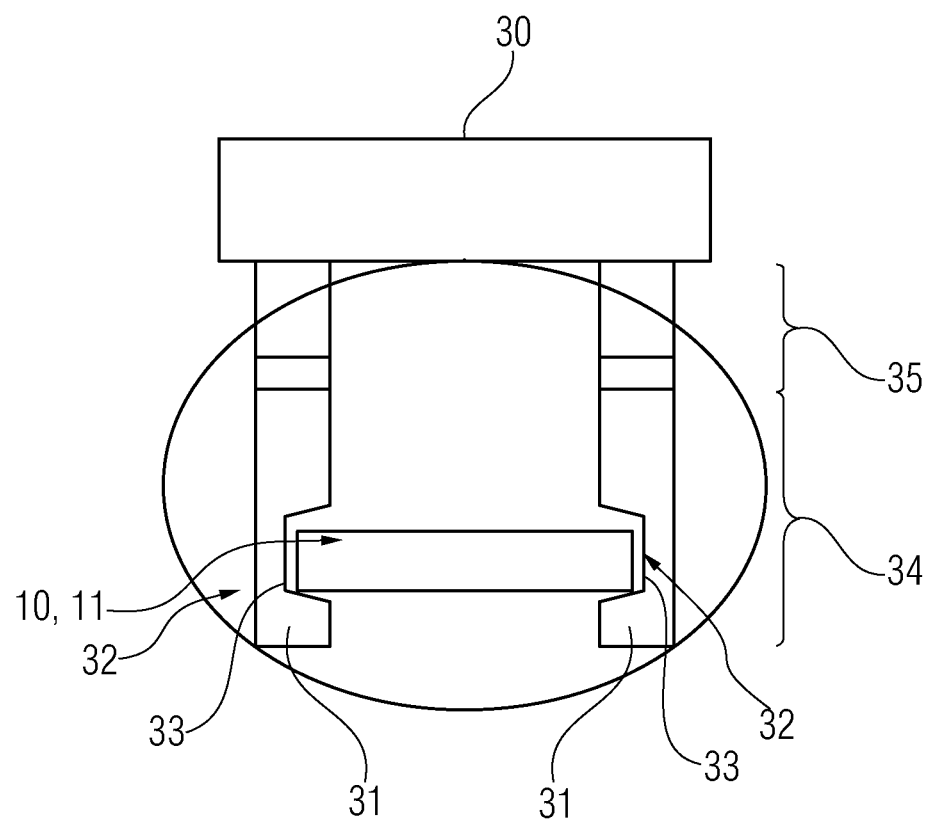
FIG. 3 shows an enlarged illustration of the holding principle of the holding devices provided in the cover.

FIG. 3 illustrates in an enlarged illustration the holding principle of a test device according to one embodiment. A detail of the cover 30 and also two holding devices 11 fastened thereto, which are engaged with an outer contour of the printed circuit board 11 of the flat module 10 via a force-locked and/or interlocked connection, are illustrated, again in a cross-sectional illustration. In this exemplary embodiment illustrated in FIG. 3, each of the holding devices 31 comprises a rigid portion 34 and a flexible portion 35. An angular groove 33 merely exemplary in this instance is formed in the rigid portion 34 and can produce a force-locked and/or interlocked connection to the printed circuit board 11. The holding devices for producing the force-locked and/or interlocked connection are deflectable via the flexible portion 35, such that the outer contour of the printed circuit board 11 can be pressed into the grooves 33.

The merely exemplary provision of the grooves 33 in the rigid portions 34 enables the use of a wear-free material, for example of a metal. This is not mandatory however. The flexible portion 35 can be formed by a suitable spring element, such as a spiral spring and the like, or by suitable material selection. For example, the flexible portion 35 could also consist completely of a resilient plastic. It is also possible to manufacture the holding devices 31 over their entire length from a resilient material, for example a plastic.

It is clear to a person skilled in the art that the holding devices can be embodied in a variety of ways. The suitable shape and/or material selection must merely ensure that the holding device is deflectable and/or deformable in such a way that the necessary force-locked and/or interlocked connection for holding the flat module when the cover is opened into its removal position is ensured.

The process of the handling of the test device 1 according to one embodiment will be explained in greater detail hereinafter on the basis of FIGS. 4 to 9. For the sake of clarity, merely the components necessary for this purpose (the cover 30, the holding devices 31, the test prods 21 and the printed circuit board 11 of the flat module 10 to be tested) are illustrated.

Figure 4:
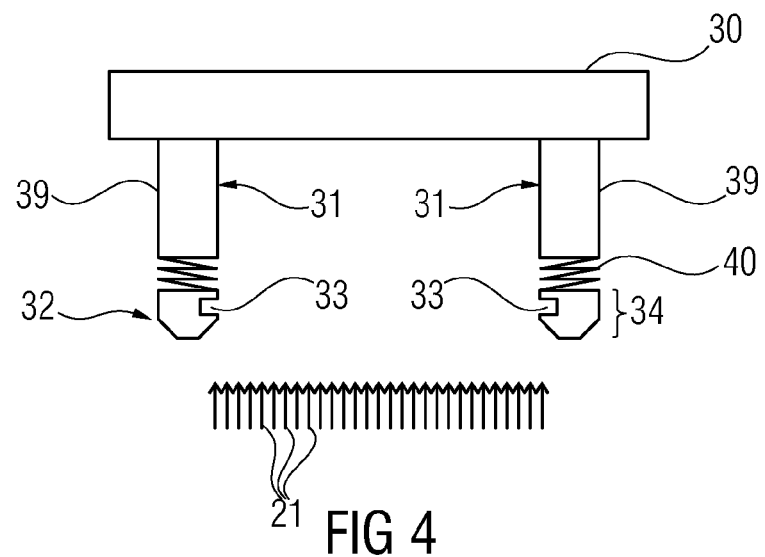
FIGS. 4 to 9 show schematic illustrations of the sequence of the operation of a test device according to one embodiment.

FIG. 4 shows the test device in its removal position, in which the cover 30 is opened relative to the test station 20 in accordance with the illustration shown in FIG. 1. Since no force acts on the holding devices 31, these are oriented approximately parallel to one another.

The removal position then makes it possible to place the flat module 10 (test specimen) onto the test station 20. This is symbolized schematically by the printed circuit board 11 arranged above the test prods 21. Since, in this case, the holding devices 31 have no mechanical contact with the printed circuit board, they are also in their starting position.

Figure 6:
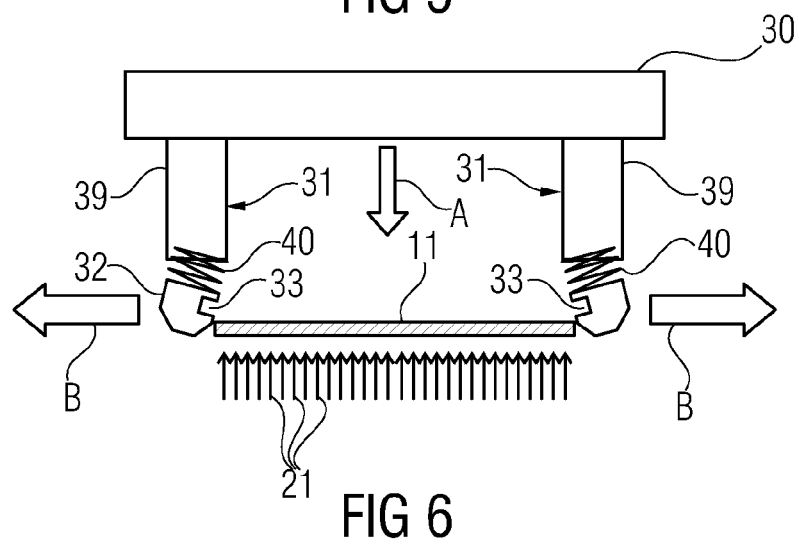

In accordance with FIG. 6, the cover is then closed, that is to say a movement is performed from the removal position into the test position shown in FIG. 2. The movement of the cover downwards is characterized by the arrow A. Due to the movement of the cover 30 in the direction of the test station 20, the holding devices 31 are moved towards the flat module 10 to be tested. At a determined moment in time, the detent lugs 31 enter into mechanical engagement with the outer contour of the printed circuit board 11 of the flat module 10. The detent lugs 32 are thus deformed outwardly due to the spring elements and/or flexible portions provided in the holding devices 11. Reference sign 39 denotes rigid portions of the holding devices 31. This is illustrated by the arrows denoted by B. By means of a continued movement in the direction A, the grooves in the detent lugs 32 ultimately enter into engagement with the outer contour. This is illustrated schematically in FIG. 7.

Figure 5:
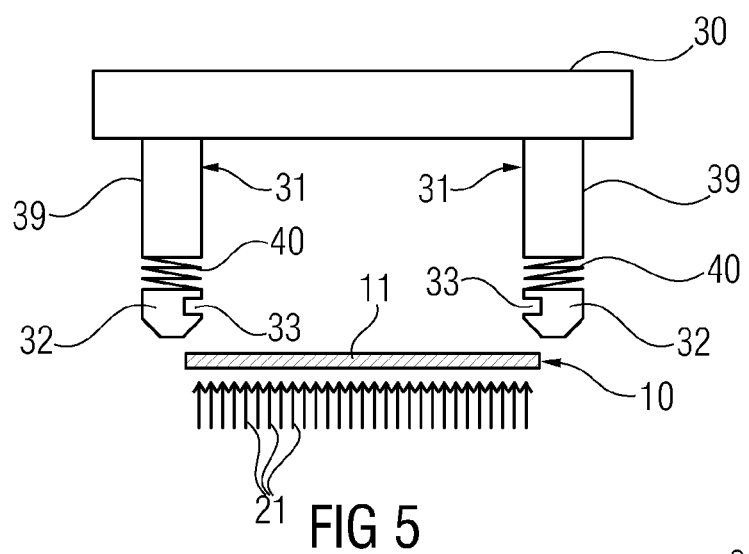

Since the arrangement of the holding devices is matched to the size or dimensions of the printed circuit board 11, the holding devices in the "latched" state are approximately or exactly in the starting position shown in FIGS. 4 and 5. This means that the spring elements 40 are not loaded by force or are hardly loaded by force. The actual test procedure of the flat module 10 can then be carried out. To this end, the test prods 21 are brought towards the positions or solder contacts provided on the flat module 11 in a manner known to a person skilled in the art and not explained in greater detail. Here, the hold-down devices (not illustrated in FIGS. 4 to 9) ensure a counterforce on the printed circuit board, such that the printed circuit board is not bent by the application of force of the test prods 21.

Figure 7:
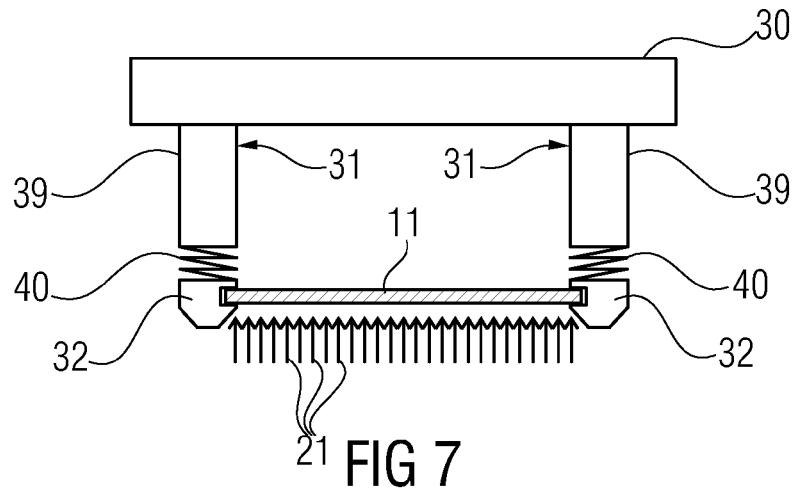
Figure 8:
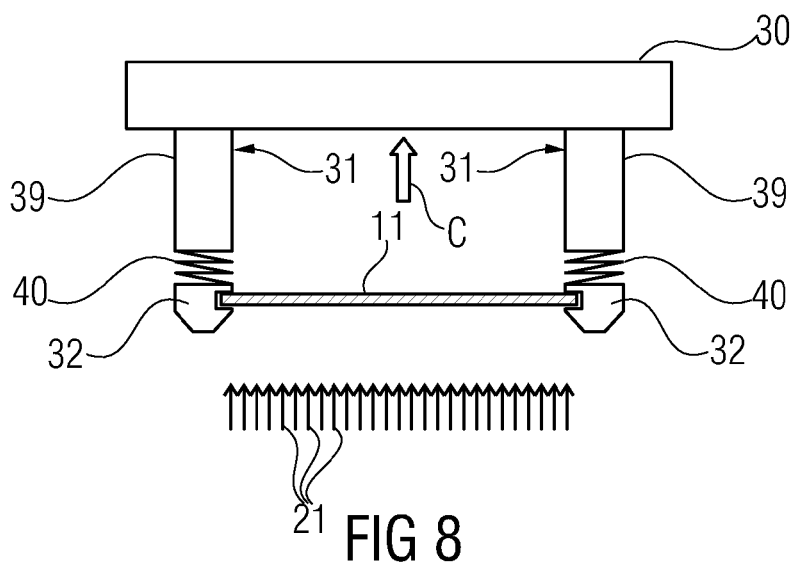

Once the testing of the flat module is finished, the cover is again brought from its test position shown in FIG. 7 into the removal position. The direction of movement is denoted in FIG. 8 by the arrow C. Due to the latching of the printed circuit board 11 with the holding devices 31, the flat module 10 is entrained by the cover 30, such that the test station 20 or the support surface 22 thereof is already free for the renewed placement of a further test specimen. Once a new test specimen has been placed into the test station 20, the tested flat module can then be removed from the holding device by applying a corresponding force for deflection of the holding devices 31. This can be implemented for example by an operator of the test device.

Figure 9:
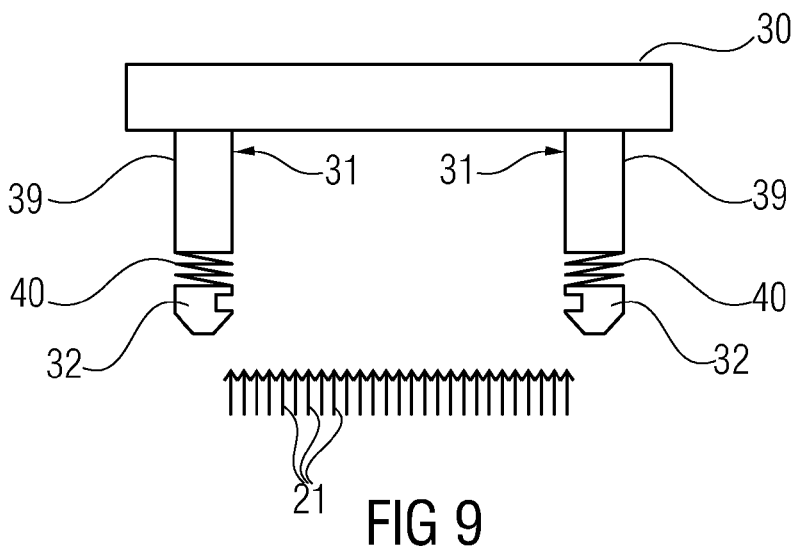

In FIG. 9, the flat module 10, entrained by the cover 30, has been removed already before the insertion of another flat module to be tested, which constitutes an alternative to the above-described procedure.

A simple, variable and cost-effective principle for functional extension of a test device is thus provided, by means of which handling operations can be reduced and set-down areas can be eliminated.

What is claimed is:

1. A test device for testing an electronic module, the test device comprising:
    a test station including a support surface for receipt of an electronic module to be tested,
    a cover movable relative to the test station and the support surface between a closed electronic module test position covering the support surface and an open electronic module removal position,
    at least two flexible holding devices arranged on the underside of the cover wherein when the cover moves from its open removal position into the closed test position covering the support surface and any electronic module to be tested, the at least two flexible holding devices deflect outwardly over an outer contour of any electronic module arranged on the support surface in the test station and then return to a non-deflected position engaged with the electronic module, wherein moving the cover from its closed test position to the open removal position removes any electronic module in the test station from the support surface and holds any electronic module above the support surface by means of the engagement with the at least two flexible holding devices, clearing the support surface for receipt of a next electronic module to be tested.

2. The test device of claim 1, wherein a respective holding device is formed in such a way that the holding force for holding the electronic module is produced by a force-locked or interlocked connection.

3. The test device of claim 1, wherein a respective holding device is formed or arranged such that the holding device can be brought into engagement with a printed circuit board of the electronic module.

4. The test device of claim 1, wherein a respective holding device is deflectable or resilient in only some portions.

5. The test device of claim 4, wherein a portion having resilient properties comprises a spring element.

6. The test device of claim 4, wherein a portion having resilient properties is formed from a plastic.

7. The test device of claim 4, wherein the deflectable or resilient portion is designed to generate a restoring force counteracting the deflection.

8. The test device of claim 4, wherein a deflection of the at least one holding device is allowed in a direction that is approximately parallel to a primary plane of the electronic module which is flat.

9. The test device of claim 1, wherein a respective holding device comprises a detent lug.

10. The test device of claim 9, wherein the detent lug is formed by a groove in the holding device.

11. The test device of claim 10, wherein the groove is formed as an indentation.

12. The test device of claim 9, wherein the portion having the detent lug is formed from a non-resilient material.

13. The test device of claim 9, wherein the portion of the holding device having the detent lug is formed from a wear-resistant material.

14. The test device of claim 1, wherein the at least two holding devices are provided in addition to hold-down devices.

15. A test device cover for use with a test station having a support surface for receiving and testing an electronic module,
    the cover being movable relative to the test station and its support surface between a closed electronic module test position, and an open electronic module removal position, and
    the cover comprising at least two flexible holding devices arranged on the underside of the cover such that, when the cover moves from its open removal position into the closed test position covering the support surface, the at least two flexible holding devices deflect outwardly over an outer contour of any electronic module arranged in the test station and then return to a non-deflected position engaged with the electronic module,
    wherein when the cover moves from its closed test position to the open removal position, the electronic module is held by the at least two flexible holding devices and moved upwardly and away from the support surface of the test station.

16. The test device cover of claim 15, wherein a respective holding device is formed in such a way that the holding force for holding the module is produced by a force-locked or interlocked connection.

17. The test device cover of claim 15, wherein a respective holding device is formed or arranged such that the holding device can be brought into engagement with a printed circuit board of the module.

18. The test device cover of claim 15, wherein a respective holding device is deflectable or resilient in only some portions.

19. The test device cover of claim 18, wherein a portion having resilient properties comprises a spring element.

20. The test device cover of claim 18, wherein the deflectable or resilient portion is designed to generate a restoring force counteracting the deflection.

* * * * *